United States Patent
Kim et al.

(10) Patent No.: US 10,096,659 B2
(45) Date of Patent: Oct. 9, 2018

(54) TOP EMISSION TYPE ORGANIC LIGHT EMITTING DIODE DISPLAY DEVICE

(71) Applicant: LG Display Co., Ltd., Seoul (KR)

(72) Inventors: Sookang Kim, Paju-si (KR); Soyoung Jo, Seoul (KR); Wonhoe Koo, Goyang-si (KR); Jihyang Jang, Goyang-si (KR); Hyunsoo Lim, Goyang-si (KR); Mingeun Choi, Asan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/394,628

(22) Filed: Dec. 29, 2016

(65) Prior Publication Data

US 2018/0190719 A1    Jul. 5, 2018

(51) Int. Cl.
*H01L 27/32* (2006.01)
*H01L 51/52* (2006.01)

(52) U.S. Cl.
CPC .......... *H01L 27/322* (2013.01); *H01L 27/326* (2013.01); *H01L 27/3246* (2013.01); *H01L 51/5209* (2013.01); *H01L 51/5225* (2013.01); *H01L 51/5271* (2013.01); *H01L 51/5275* (2013.01); *H01L 2251/5315* (2013.01)

(58) Field of Classification Search
CPC ............. H01L 51/5209; H01L 51/5225; H01L 51/5253; H01L 51/5203; H01L 51/5275; H01L 51/5271; H01L 27/322
See application file for complete search history.

(56) References Cited

U.S. PATENT DOCUMENTS

| 2008/0024402 A1* | 1/2008 | Nishikawa .......... H01L 51/5209 345/82 |
| 2008/0122347 A1* | 5/2008 | Lee ..................... H01L 27/3244 313/504 |
| 2011/0073876 A1 | 3/2011 | Yoshida et al. |
| 2014/0001450 A1 | 1/2014 | Shinotsuka et al. |
| 2014/0042426 A1* | 2/2014 | Nishimura .......... H01L 51/5275 257/40 |
| 2014/0159022 A1 | 6/2014 | Song et al. |

(Continued)

FOREIGN PATENT DOCUMENTS

EP    2 637 480 A1    9/2013
EP    2 744 008 A1    6/2014
(Continued)

OTHER PUBLICATIONS

Office Action issued in counterpart Korean Patent Application No. 10-2015-0152668 dated May 21, 2017.

*Primary Examiner* — Tom Thomas
*Assistant Examiner* — Nilufa Rahim
(74) *Attorney, Agent, or Firm* — Polsinelli PC

(57) ABSTRACT

The present disclosure includes a top emission type organic light emitting diode display device. The top emission type organic light emitting diode display device of the disclosed present disclosure includes an overcoating layer disposed on a substrate and including a plurality of convex portions or a plurality of concave portions in which a full width at half maximum is greater than a radius, a first electrode disposed on the overcoating layer, an organic light emitting layer disposed on the first electrode, and a second electrode disposed on the organic light emitting layer.

18 Claims, 15 Drawing Sheets

(56) References Cited

U.S. PATENT DOCUMENTS

2015/0001507 A1* 1/2015 Kim .................... H01L 27/3246
257/40
2017/0162830 A1* 6/2017 Hirakata ............. H01L 51/5209

FOREIGN PATENT DOCUMENTS

JP      P2015-103406 A   6/2015
KR   10-2015-0077279 A1   7/2015

* cited by examiner

TOP EMISSION TYPE ORGANIC LIGHT EMITTING DIODE DISPLAY DEVICE

BACKGROUND DISCLOSURE

Field of the Disclosure

The present disclosure relates to a display device, and more particularly, to a top emission type organic light emitting diode display device. Although the present disclosure is suitable for a wide scope of applications, it is particularly suitable for improving an external light emission efficiency as well as a power consumption in the top emission type organic light emitting diode display device.

Description of the Background

Recently, an organic light emitting diode display device that has been spotlighted as a display device uses an organic light emitting diode (OLED) that emits light by itself, and thus has a high response speed, a high contrast ratio, a high light emission efficiency, a high luminance, and a wide viewing angle.

Light emitted from an organic light emitting layer of the organic light emitting diode display device passes through several elements of the organic light emitting diode display device and gets out of the organic light emitting diode display device. However, a portion of light which is emitted from the organic light emitting layer does not get out of the organic light emitting diode display device, but is locked in the organic light emitting diode display device. Therefore, a light extraction efficiency of the organic light emitting diode display device becomes an issue. In order to improve the light extraction efficiency of the organic light emitting diode display device, a method of attaching a micro lens array (MLA) to the outside of a substrate of the organic light emitting diode display device is being used.

SUMMARY

The present disclosure has been made in an effort to provide a top emission type organic light emitting diode display device in which external light emission efficiency is improved and power consumption is reduced.

According to an aspect of the present disclosure, there is provided a top emission type organic light emitting diode display device. The top emission type organic light emitting diode display device includes an overcoating layer disposed on a substrate and including a plurality of convex portions or a plurality of concave portions in which a full width at half maximum is greater than a radius, a first electrode disposed on the overcoating layer, an organic light emitting layer disposed on the first electrode, and a second electrode disposed on the organic light emitting layer.

As described above, according to the exemplary aspects, a top emission type organic light emitting diode display device in which external light emission efficiency is improved and power consumption is reduced can be provided.

It is to be understood that both the foregoing general description and the following detailed description are exemplary and explanatory and are intended to provide further explanation of the disclosure as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ASPECT

Figure 1:
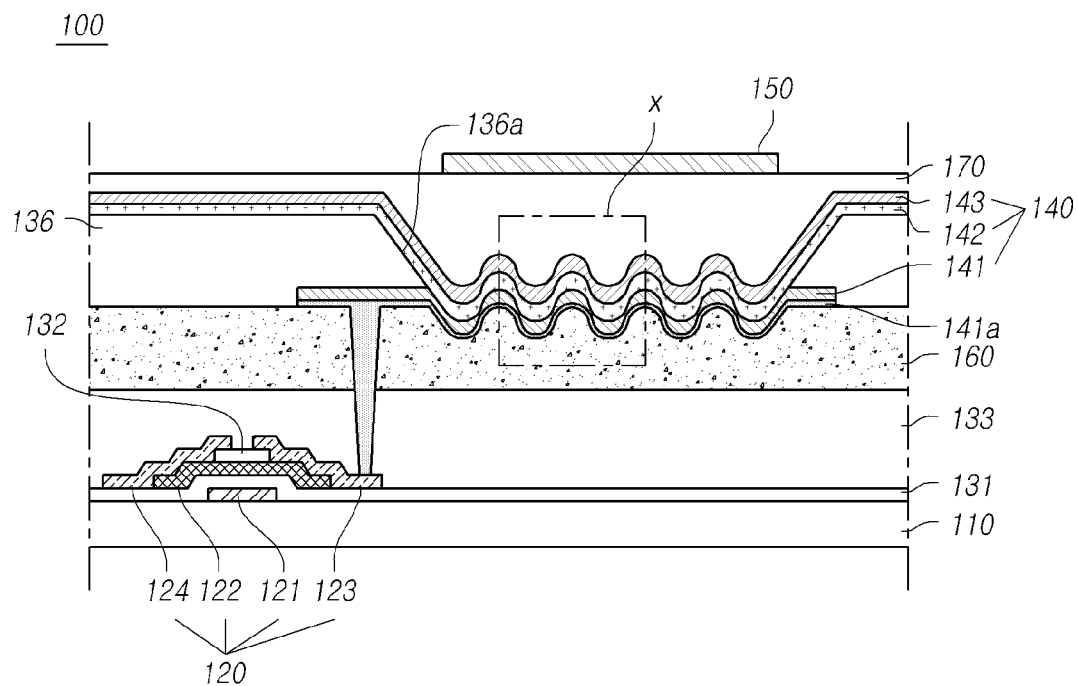
FIG. 1 is a cross-sectional view of a top emission type organic light emitting diode display device according to one exemplary aspect.

Hereinafter, some exemplary aspects of the present disclosure will be described in detail with reference to the accompanying drawings. When reference numerals are assigned to components of each drawing, it should be noted that, even when the same components are illustrated in different drawings, the same numerals are assigned to the same components whenever possible. In addition, in descriptions of the present disclosure, when detailed descriptions of related well-known technology are deemed to unnecessarily obscure the gist of the disclosure, they will be omitted.

Further, in describing components of the present disclosure, terminologies such as first, second, A, B, (a), and (b) may be used. These terms are only used to distinguish one component from another component, but the nature, order, or number of the corresponding components is not limited by these terms. It will be understood that when an element is referred to as being "connected" or "coupled" to another element, it can be directly connected or coupled to another element, intervening elements may be present, or it can be connected or coupled to another element through the other element.

Figure 2A:
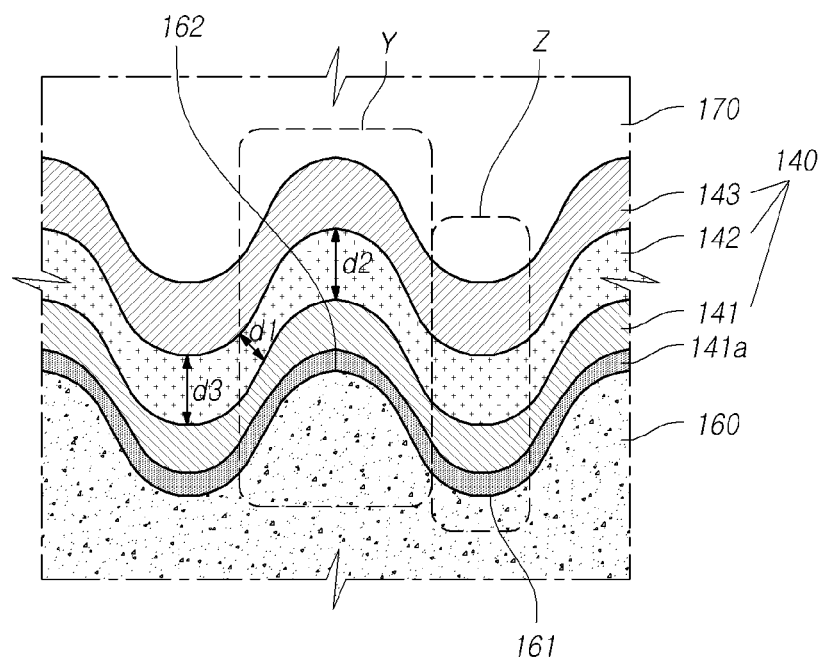
FIG. 2A is an enlarged cross-sectional view of area X of FIG. 1.
Figure 2B:
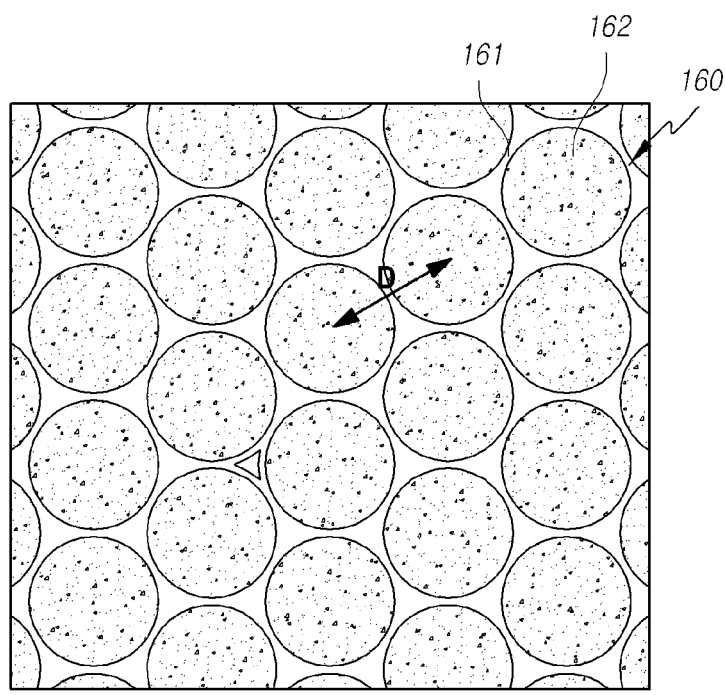
FIG. 2B is a partial plan view of an overcoating layer in area X of FIG. 1.

FIG. 1 is a cross-sectional view of a top emission type organic light emitting diode display device according to one exemplary aspect. FIG. 2A is an enlarged cross-sectional view of area X of FIG. 1. FIG. 2B is a partial plan view of an overcoating layer in area X of FIG. 1.

Referring to FIGS. 1 and 2A, a top emission type organic light emitting diode display device 100 according to one exemplary aspect includes a substrate 110, a thin film transistor 120, an overcoating layer 160, an organic light emitting diode 140, and a color filter 150.

The top emission type organic light emitting diode display device 100 illustrated in FIGS. 1 and 2A is described as being an organic light emitting diode display device in an upper emission type or a top emission type, in which the color filter 150 is positioned at a side opposite to the substrate 110, but may be an organic light emitting diode display device in a lower emission type or a bottom emission type, in which the color filter 150 is positioned at the substrate 110 side. Generally, the top emission type organic light emitting diode display device 100 has an aperture ratio greater than that of the bottom emission type organic light emitting diode display device, and thus has an advantage in a life span and luminance.

The thin film transistor 120 including a gate electrode 121, an active layer 122, a source electrode 123 and a drain electrode 124, is disposed on the substrate 110.

Specifically, the gate electrode 121 is disposed on the substrate 110, a gate insulating layer 131 for insulating the gate electrode 121 from the active layer 122 is disposed on the gate electrode 121 including the substrate 110, the active layer 122 is disposed on the gate insulating layer 131, an etch stopper 132 is disposed on the active layer 122, and the source electrode 123 and the drain electrode 124 are disposed on the active layer 122 and the etch stopper 132. The source electrode 123 and the drain electrode 124 in a manner of being in contact with the active layer 122 are electrically connected to the active layer 122, and are disposed on a portion of the etch stopper 132. The etch stopper 132 may not be disposed.

In the present disclosure, only a driving thin film transistor among various thin film transistors which may be included in the top emission type organic light emitting diode display device 100 is illustrated for convenience of description. Further, in the present disclosure, the thin film transistor 120 is described as having an inverted staggered structure or a bottom gate structure, in which the gate electrode 121 is positioned at a side opposite to the source electrode 123 and the drain electrode 124 with respect to the active layer 122, but a thin film transistor having a coplanar structure or a top gate structure, in which the gate electrode 121 is positioned at a side, at which the source electrode 123 and the drain electrode 124 are positioned, with respect to the active layer 122, may be used.

Although a passivation layer 133 is illustrated as planarizing an upper portion of the thin film transistor 120 in FIG. 1, the passivation layer 133 may not planarize the upper portion of the thin film transistor 120 and may be disposed along surface shapes of elements positioned thereunder.

The overcoating layer 160 is disposed on the passivation layer 133. Although the passivation layer 133 is illustrated as being included in the top emission type organic light emitting diode display device 100 in FIG. 1, the passivation layer 133 may not be used and the overcoating layer 160 may be directly disposed on the thin film transistor 120.

The overcoating layer 160 includes a plurality of convex portions 162 and first connection portions 161 which connect adjacent convex portions 162. The first connection portion 161 is a portion positioned between adjacent convex portions 162. The overcoating layer 160 functions as a planarizing layer at portions in which the plurality of convex portions 162 are not disposed.

As illustrated in FIG. 2B, each of the plurality of convex portions 162 and the first connection portions 161 may have a generally circular shape in a plan view, but the present disclosure is not limited thereto, and may have various shapes such as a generally hemispherical shape, a semi-ellipsoidal shape, a rectangular shape, a hexagonal shape, and the like. The plurality of convex portions 162 may be disposed in a circular shape in a plan view. In other words, the convex portion 162 having a circular shape and another convex portion 162 adjacent thereto may be disposed in a circular-shaped structure to be integrally formed with one shared side.

A bank layer 136 and the organic light emitting diode 140 including a first electrode 141, an organic light emitting layer 142, and a second electrode 143 are disposed on the overcoating layer 160. In this case, although not illustrated, an insulating second passivation layer (not illustrated) may be added between the overcoating layer 160 and the first electrode 141 so as to have a shape depending on a morphology of the convex portion 162 of the overcoating layer 160 while preventing outgas from being diffused from the overcoat layer 160 to the organic light emitting diode 140 and to have a refractive index similar to that of the first electrode 141.

Specifically, the first electrode 141 for supplying one among electrons and holes to the organic light emitting layer 142 is disposed on a portion of the overcoating layer 160. The first electrode 141 may be a positive electrode, a pixel electrode or an anode in a normal organic light emitting diode (OLED), and may be a negative electrode, a pixel electrode or a cathode in an inverted OLED.

A reflection plate 141a formed of, for example, a conductive material may be included at a lower portion of the first electrode 141. The reflection plate 141a may reflect light emitted from the organic light emitting layer 142 to improve top light emission efficiency. When the first electrode 141 itself functions as a reflection plate, a separate reflection plate 141a may not be included at the lower portion of the first electrode 141.

When the reflection plate 141a is included at the lower portion of the first electrode 141, the reflection plate 141a may be patterned in the same manner as the first electrode 141. Therefore, the first electrode 141 and the reflection plate 141a may function as multiple electrodes. Further, the first electrode 141 may be a multiple electrode including multiple layers, for example, double electrodes, and the reflection plate 141a may be included in the multilayered first electrode 141. Hereinafter, the case in which the reflection plate 141a is included at the lower portion of the first electrode 141 and the first electrode 141 and the reflection plate 141a function as multiple electrodes will be described.

The reflection plate 141a and the first electrode 141 may be connected to the source electrode 123 of the thin film transistor 120 through a contact hole formed in the overcoating layer 160. In the present disclosure, the first electrode 141 is described as being connected to the source electrode 123 assuming a case in which the thin film transistor 120 is an N-type thin film transistor, but the reflection plate 141a and the first electrode 141 may be connected to the drain electrode 124 in a case in which the thin film transistor 120 is a P-type thin film transistor. The first electrode 141 may be in direct contact with the organic light emitting layer 142, or may be electrically connected to the organic light emitting layer 142 to be in contact therewith, with a conductive material interposed therebetween.

The reflection plate 141a and the first electrode 141 are disposed to have a shape depending on a morphology of a surface of the overcoating layer 160. Therefore, the reflection plate 141a and the first electrode 141 have a convex morphology at the convex portion 162 of the overcoating layer 160.

The bank layer 136 including an opening 136a through which the first electrode 141 is exposed is disposed on the overcoating layer 160, the reflection plate 141a, and the first electrode 141. The bank layer 136 may serve to distinguish adjacent pixel areas (or sub pixel areas), and may be disposed between adjacent pixel areas (or sub pixel areas).

The convex portion 162 and the first connection portion 161 of the overcoating layer 160 are disposed to overlap the opening 136a of the bank layer 136. Since the convex portion 162 and the first connection portion 161 of the overcoating layer 160 are disposed to overlap the color filter 150 to be described below, the convex portion 162 and the first connection portion 161 of the overcoating layer 160 overlap the opening 136a of the bank layer 136, and the color filter 150 above.

The organic light emitting layer 142 is disposed on the first electrode 141, and the second electrode 143 for supplying one among electrons and holes to the organic light emitting layer 142 is disposed on the organic light emitting layer 142. The organic light emitting layer 142 is disposed in a structure (e.g., a tandem white structure) in which a plurality of organic light emitting layers are stacked in order to emit white light. The organic light emitting layer 142 includes a first organic light emitting layer which emits blue light and a second organic light emitting layer which is disposed on the first organic light emitting layer and emits light having a color that becomes white by being mixed with blue. The second organic light emitting layer may be, for example, an organic light emitting layer which emits yellow-green light. Meanwhile, the organic light emitting layer 142 may include only an organic light emitting layer which emits one of blue light, red light, and green light. In this case, the color filter 150 may not be included therein. The second electrode 143 may be a negative electrode, a common electrode, or a cathode in a normal OLED, and may be a positive electrode, a common electrode or an anode in an inverted OLED.

When the color filter 150 is included therein, the color filter 150 is disposed on the second electrode 143. An adhesion layer 170 may be included between the second electrode 143 and the color filter 150.

The color filter 150 is for converting a color of light emitted from the organic light emitting layer 142, and may be one of a red color filter, a green color filter, and a blue color filter.

The color filter 150 is disposed at a position corresponding to an emission area on the second electrode 143. Here, the emission area refers to an area in which the organic light emitting layer 142 emits light by the first electrode 141 and the second electrode 143, and that the color filter 150 is disposed at a position corresponding to the emission area signifies that the color filter 150 is disposed so as to prevent a blurring phenomenon and a ghost phenomenon from occurring by mixing lights emitted from adjacent emission areas.

For example, the color filter 150 is disposed to overlap the emission area, and specifically, may have a size less than or equal to that of the emission area. However, a size and arrangement position of the color filter 150 may be determined by various factors such as a size and position of the emission area, a distance between the color filter 150 and the second electrode 143, a distance between the emission areas, and the like.

Referring to FIG. 2A, a thickness of the organic light emitting layer 142 between the convex portion 162 and the first connection portion 161 of the overcoating layer 160 may be smaller than a thickness of the organic light emitting layer 142 at a bottom of the convex portion 162 of the overcoating layer 160 or at a top of the first connection portion 161. Specifically, the thickness of the organic light emitting layer 142 may be smallest at a position at which a slope of the organic light emitting layer 142 between the convex portion 162 and the first connection portion 161 of the overcoating layer 160 is largest.

For example, when the organic light emitting layer 142 is formed in a deposition method, a thickness of the organic light emitting layer 142 deposited in a direction perpendicular to the substrate 110 is the same, but the organic light emitting layer 142 may have a shape depending on a morphology of the overcoating layer 160. Due to characteristics of the deposition process, a thickness d1 of the organic light emitting layer 142 which drives a current between the first electrode 141 and the second electrode 143 is smallest at a position at which the slope of the organic light emitting layer 142 is largest. Thicknesses d2 and d3 of the organic light emitting layer 142 which drives a current between the first electrode 141 and the second electrode 143 is largest at a position at which the slope of the organic light emitting layer 142 is smallest, that is, at a bottom or top thereof.

In terms of an amount of emission of the organic light emitting layer 142 according to the thicknesses d1, d2, d3, etc. of the organic light emitting layer 142, an amount of emission per unit area of the organic light emitting layer 142 between the convex portion 162 and the first connection portion 161 of the overcoating layer 160 may be greater than an amount of emission per unit area of the organic light emitting layer 142 at the bottom of the convex portion 162 or at the top of the first connection portion 161. Specifically, the amount of emission of the organic light emitting layer 142 may be the largest at a position at which the slope of the organic light emitting layer 142 between the convex portion 162 and the first connection portion 161 of the overcoating layer 160 is largest.

The organic light emitting layer 142 and the second electrode 143 are disposed to have a shape depending on the morphology of the surface of the overcoating layer 160. As a result, a shape of the organic light emitting diode 140 having a micro lens array structure may be implemented using the convex portion 162 of the overcoating layer 160.

When the organic light emitting diode 140 has a micro lens array structure for improving an external light extraction efficiency, a convex curvature is generated on the surface of the organic light emitting diode 140 by the convex portion 162 of the overcoating layer 160 as illustrated in FIG. 2A due to a characteristic of the pattern. In this case, since a thinnest thickness d1 of the organic light emitting layer 142 between the first electrode 141 and the second electrode 143 is reduced in the area having a large slope, an efficient emission area Y in which electric fields are locally concentrated, that is, an area between the convex portion 162 and the first connection portion 161 of the overcoating layer 160, is formed. When the organic light emitting diode 140 is driven, the electric fields are locally concentrated in such an efficient emission area, a main current path is formed, and the main emission occurs. However, light is rarely extracted in an inefficient emission area Z in the convex portion 162 of the overcoating layer 160. In the inefficient emission area Z, light is rarely extracted despite power consumption, and thus the external light extraction efficiency is reduced.

In the top emission type organic light emitting diode display device 100 according to one exemplary aspect, a micro lens array pattern having a convex shape may be included in the overcoating layer 160. Light emitted from the organic light emitting layer 142 is locked in the organic light emitting layer 142 and the second electrode 143 while being totally reflected, but the light travels at an angle smaller than a critical angle for total reflection by the inserted micro lens array structure, and thus the external light emission efficiency may be increased by multiple reflections.

In this case, a traveling angle of the light emitted from the organic light emitting layer 142 is changed by the inserted micro lens array pattern, and the traveling angle of the light may be clearly changed even by a minute difference in a shape of the micro lens array.

The shape of the convex portion 162 of the overcoating layer 160 is formed through a process such as a photolithography process and the like, and the morphology of the convex portion 162 of the overcoating layer 160 may be adjusted by controlling a heat treatment process performed at this time. A material of the overcoating layer 160 may be a general positive or negative photoresist. For example, the material of the overcoating layer 160 may be a negative photoresist in which an exposed portion is cured. When the material of the overcoating layer 160 is a negative photoresist, it may be advantageous to form the overcoating layer 160 having a full width at half maximum greater than a radius. Therefore, when the material of the overcoating layer 160 is a negative photoresist, the overcoating layer 160 having a reversed shape of a mask may be formed.

Such a configuration will be described in more detail as follows. In order to form the convex portion 162 of the overcoating layer 160, the convex portion 162 of the overcoating layer 160 is patterned in a convex shape through a photolithography process by being coated with a photoresist, and heat treatment is then performed thereon. In this case, the shape of the convex portion 162 of the overcoating layer 160 may be formed by sequentially performing the heat treatment in two steps rather than performing the heat treatment at one time. For example, an intermediate heat treatment at a temperature ranging from about 100° C. to about 130° C. should be performed before the final heat treatment at a temperature ranging from about 200° C. to about 250° C. is performed.

In this case, a time for which the intermediate heat treatment is performed is related to the morphology of the convex portion 162 of the overcoating layer 160. As the time for which the intermediate heat treatment is performed is increased, the morphology of the finally formed convex portion 162 of the overcoating layer 160 is increased. Extremely, when only the final heat treatment is directly performed without a time for which the intermediate heat treatment is performed, the morphology of the convex portion 162 of the overcoating layer 160 disappears and the overcoating layer 160 is planarized.

Using this tendency, various top emission type organic light emitting diode display devices having different morphologies of the convex portion 162 of the overcoating layer 160 are formed. By using these top emission type organic light emitting diode display devices, when the convex portion 162 of the overcoating layer 160 had a certain morphology, that is, when the convex portion 162 of the overcoating layer 160 had a certain aspect ratio value, it was experimentally examined whether the organic light emitting diode 140 can be operated with maximum light emission efficiency.

In the top emission type organic light emitting diode display device 100 according to one exemplary aspect, light which is totally reflected and locked in the organic light emitting diode 140 is extracted to the outside through a light path changed according to the shape of the convex portion 162 of the overcoating layer 160 which is inserted for improving the external light extraction efficiency.

Since the change of the light path according to the shape of the convex portion 162 of the overcoating layer 160 which is inserted for improving the external light extraction efficiency is a main factor for improving light extraction efficiency, a diameter D, a height H, an aspect ratio A/R, a full width at half maximum F, an aspect ratio at half maximum F_A/R (=H/F), a slope S, a gap G at a bottom of the convex portion 162, an aspect ratio at half maximum Rm with respect to the aspect ratio A/R (i.e., ratio of MLA= (F_A/R)/(A/R)), and the like of the convex portion 162 of the overcoating layer 160 are used as variables on which the shape thereof depends.

Figure 3A:
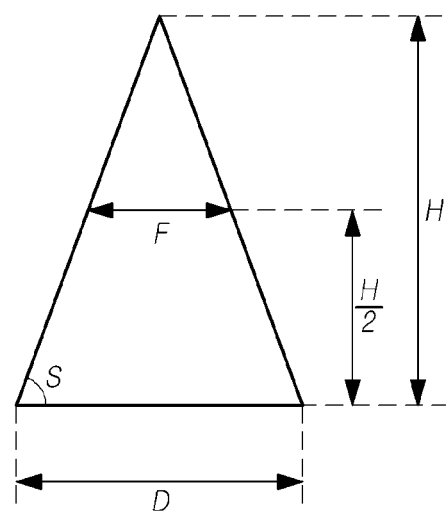
FIG. 3A is a view conceptually illustrating variables determining a shape of a convex portion of an overcoating layer.
Figure 3B:
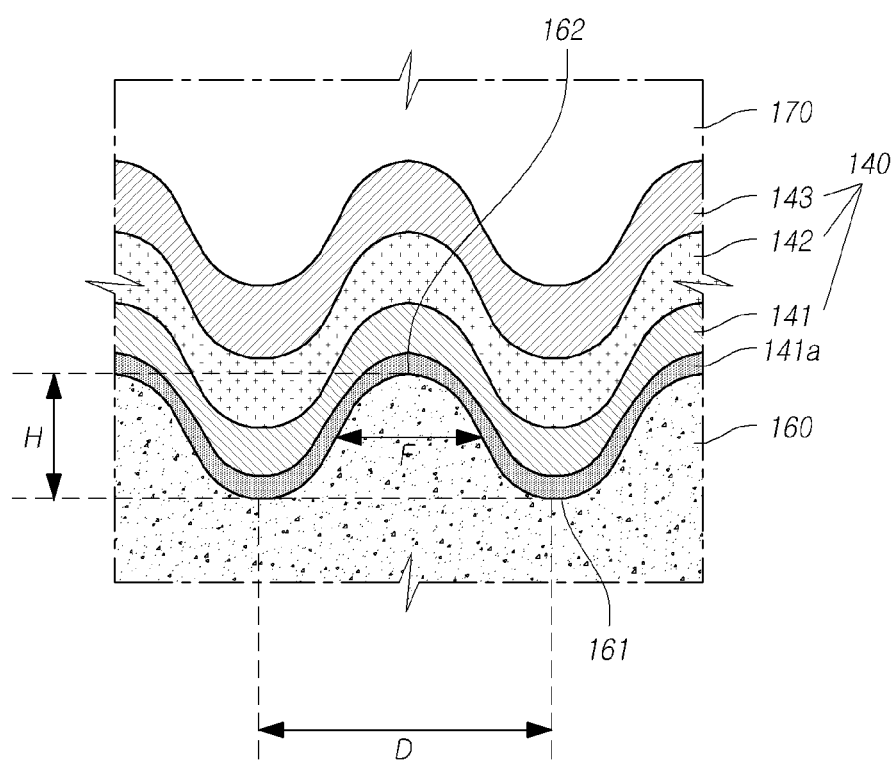
FIG. 3B is a view illustrating variables determining a shape of a convex portion of an overcoating layer in the top emission type organic light emitting diode display device according to one exemplary aspect.
Figure 3C:
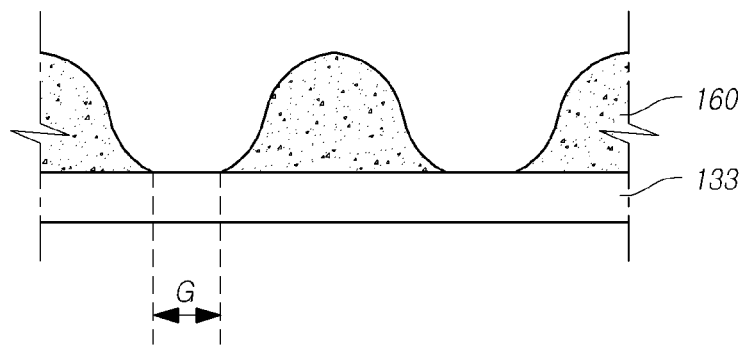
FIG. 3C is a view for describing the concept of gap G at a bottom of a convex portion of an overcoating layer.

FIG. 3A is a view conceptually illustrating variables on which a shape of a convex portion of an overcoating layer depends. FIG. 3B is a view illustrating variables determining the shape of the convex portion of the overcoating layer in the top emission type organic light emitting diode display device according to one exemplary aspect. FIG. 3C is a view for describing the concept of gap G at a bottom of the convex portion of the overcoating layer.

Referring to FIGS. 3A and 3B, a diameter D of the convex portion 162 of the overcoating layer 160 refers to a length between centers of two first connection portions 161, and a height H refers to a length from the bottom of the convex portion 162 to the top of the convex portion 162. A full width at half maximum F refers to a length between both sides of the convex portion 162 at a position of a half-height H/2 as illustrated in FIG. 3A. An aspect ratio (A/R) of the convex portion 162 refers to a value obtained by dividing the height H of the convex portion 162 by a radius D/2 of the convex portion 162.

The convex portion 162 may have a circular shape in which a diameter D ranges from about 1 μm to 5 μm and a height H ranges from about 1 μm to 4 μm.

It can be confirmed that a current efficiency enhancement is more excellent in the case in which the aspect ratio A/R of the convex portion 162 of the overcoating layer 160 has a value ranging from about 0.35 to about 0.8 than in the case in which the aspect ratio A/R of the convex portion 162 of the overcoating layer 160 has a value more than 0.8. It can be confirmed that the current efficiency enhancement is rather reduced in the case in which the aspect ratio A/R of the convex portion 162 of the overcoating layer 160 has a value more than 0.8. Specifically, it can be seen that the current efficiency enhancement is maximum in the case in which the aspect ratio A/R of the convex portion 162 of the overcoating layer 160 has a value ranging from about 0.4 to about 0.7.

Therefore, in the illustrated top emission type organic light emitting diode display device 100 according to one exemplary aspect, a surface on which the organic light emitting diode 140 is disposed may be an upper surface of the overcoating layer 160 in which the aspect ratio A/R of the convex portion 162 of the overcoating layer 160 has a value ranging from about 0.35 to about 0.8. Alternatively, in the illustrated top emission type organic light emitting diode display device 100 according to one exemplary aspect, a surface on which the organic light emitting diode 140 is disposed may be an upper surface of a second passivation layer (not illustrated) depending on the morphology of the overcoating layer 160 in which the aspect ratio A/R of the convex portion 162 of the overcoating layer 160 has a value ranging from about 0.35 to about 0.8. That is, in this case, the overcoating layer 160 or the second passivation layer (not illustrated) is a smooth non-flat plane in which an aspect ratio A/R of a surface has a value ranging from about 0.35 to about 0.8, and thus the organic light emitting diode 140 is formed on a smooth non-flat plane in which an aspect ratio has a value ranging from about 0.35 to about 0.8. Therefore, the first electrode 141, the organic light emitting layer 142, and the second electrode 143 have a shape depending on the morphology of the smooth non-flat plane.

In summary, an intermediate heat treatment process is necessarily performed in a short time when the convex portion 162 of the overcoating layer 160 is formed, and thus the convex portion 162 of the overcoating layer 160 may be formed to have a smooth slope. When the overcoating layer 160 is formed so that the aspect ratio A/R of the convex portion 162 of the overcoating layer 160 has a value ranging from about 0.35 to about 0.8 through such a method, the bank layer 136 and the organic light emitting diode 140 including the first electrode 141, the organic light emitting layer 142, and the second electrode 143 may be formed on the overcoating layer 160.

In the case in which only the aspect ratio A/R is applied as a variable which defines the shape of the convex portion 162 of the overcoating layer 160, even when ratios defined only by the diameter D and the height H are the same because the aspect ratios A/R are the same, the shape of the convex portion 162 of the overcoating layer 160 is significantly changed when values defined by the full width at half maximum F or the other variables such as gap G between the convex portions and the like are changed as illustrated in FIG. 3C.

Figure 4:
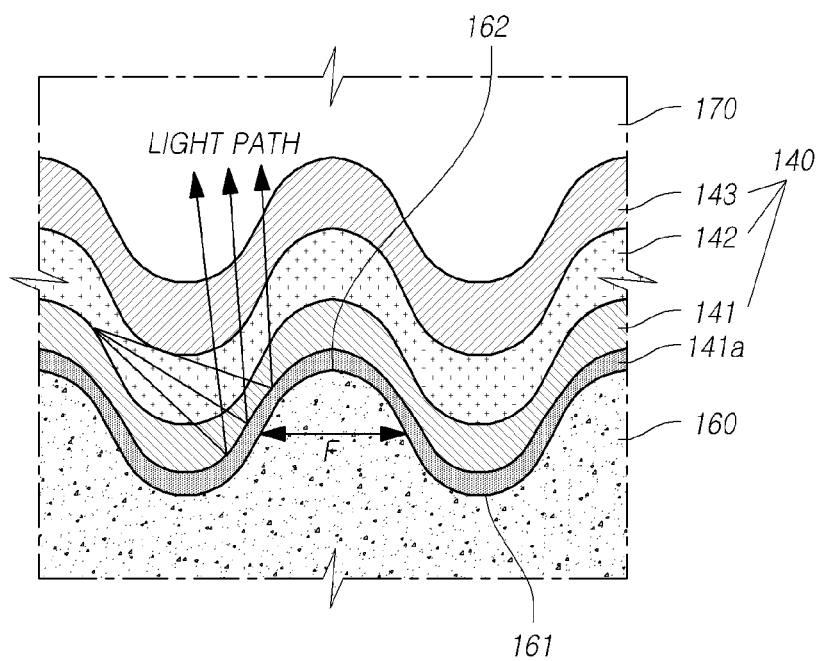
FIG. 4 is a cross-sectional view of a convex portion of an overcoating layer having a specific aspect ratio (A/R)

FIG. 4 is a cross-sectional view of a convex portion 162 of an overcoating layer 160 having a specific aspect ratio.

An aspect ratio A/R of the convex portion 162 of the overcoating layer 160 illustrated in FIG. 4 is set to about 0.45, and is included in a range of about 0.35 to about 0.8 of the convex portion 162 of the overcoating layer 160 having an excellent current efficiency enhancement as described above.

As illustrated in FIG. 2A, when the organic light emitting diode 140 has a micro lens array structure for improving the external light extraction efficiency, since a thinnest thickness d1 of the organic light emitting layer 142 between the first electrode 141 and the second electrode 143 is reduced in an area of the convex portion 162 of the overcoating layer 160 having a large slope S due to a characteristic of the pattern, an efficient emission area Y in which electric fields are locally concentrated, that is, an area between the convex portion 162 and the first connection portion 161 of the overcoating layer 160, is formed.

In other words, a maximum slope Smax of the convex portion 162 is positioned at a position at which the organic light emitting layer 142 has a thinnest thickness d1.

Meanwhile, some light emitted from the organic light emitting layer 142 travels in an upward direction, but some light travels toward the reflection plate 141a and is reflected by the reflection plate 141a, and thus a light path is changed to the upward direction.

Figure 5A:
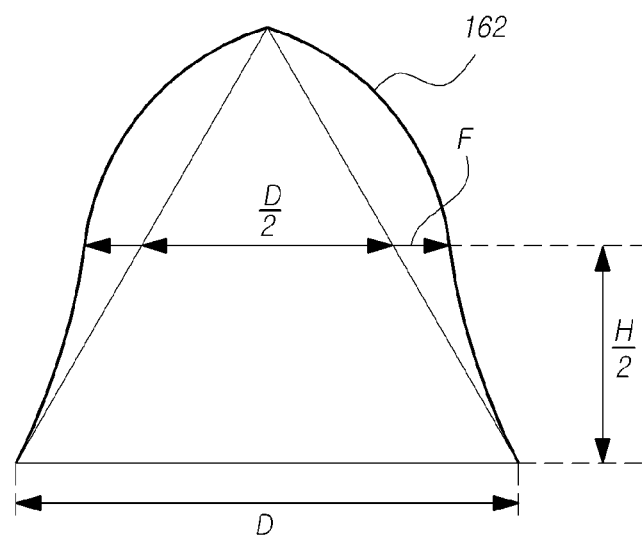
FIGS. 5A and 5B illustrate various shapes of a convex portion of an overcoating layer having the same or a similar aspect ratio.
Figure 5B:
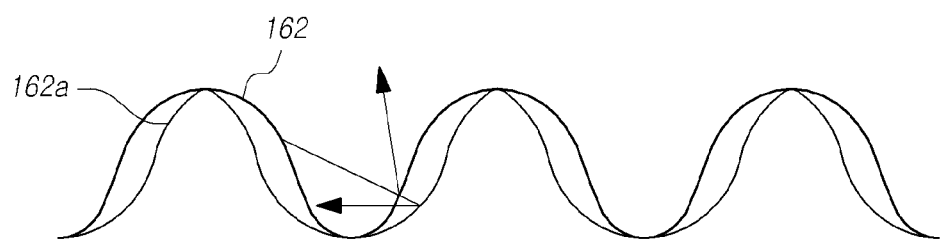

FIGS. 5A and 5B illustrate various shapes of a convex portion of an overcoating layer having the same or similar aspect ratio (A/R).

Referring to FIG. 5A, when a shape of the convex portion 162 of the overcoating layer 160 is a triangular shape as illustrated in FIG. 3A, a full width at half maximum F of the convex portion 162 of the overcoating layer 160 is a half diameter D/2. The convex portion 162 of the overcoating layer 160 included in the top emission type organic light emitting diode display device 100 according to one exemplary aspect may have a full width at half maximum F greater than a radius D/2.

In FIG. 5B, a comparison of a convex portion 162 of an overcoating layer 160 having a shape in which a full width at half maximum F is greater than a radius D/2 and a convex portion 162a of an overcoating layer 160 having a shape in which a full width at half maximum F is smaller than a radius D/2 is illustrated. In FIG. 5B, a light path on which light emitted from the organic light emitting layer 142 at the same position is reflected by the convex portion 162a having a shape different from that of the convex portion 162 of the overcoating layer 160 is illustrated.

In view of the top emission type organic light emitting diode display device 100 according to one exemplary aspect, since the full width at half maximum F of the convex portion 162 of the overcoating layer 160 is greater than the radius D/2 thereof signifies that the convex portion 162 is formed wider between side surfaces, a light path in a direction of a side surface of the reflection plate 141a is reduced, and thus an external light extraction efficiency may be improved.

On the other hand, as described above, since the full width at half maximum F of the convex portion 162a of the overcoating layer 160 is smaller than the radius D/2 signifies that the convex portion 162a is formed thinner between side surfaces, a light path in the direction of the side surface of the reflection plate 141a is increased, and thus the external light extraction efficiency may be reduced.

Therefore, in the top emission type organic light emitting diode display device 100 according to one exemplary aspect including the convex portion 162 of the overcoating layer 160 having a shape in which a full width at half maximum F is greater than a radius D/2, a light path in the direction of the side surface of the reflection plate 141a is reduced, and thus the external light extraction efficiency may be improved.

In this case, in the convex portion 162 of the overcoating layer 160 included in the top emission type organic light emitting diode display device 100 according to one exemplary aspect, a ratio of the full width at half maximum F with respect to the radius D/2 of the convex portion 162 may be about 1.0 or more.

Figure 6:
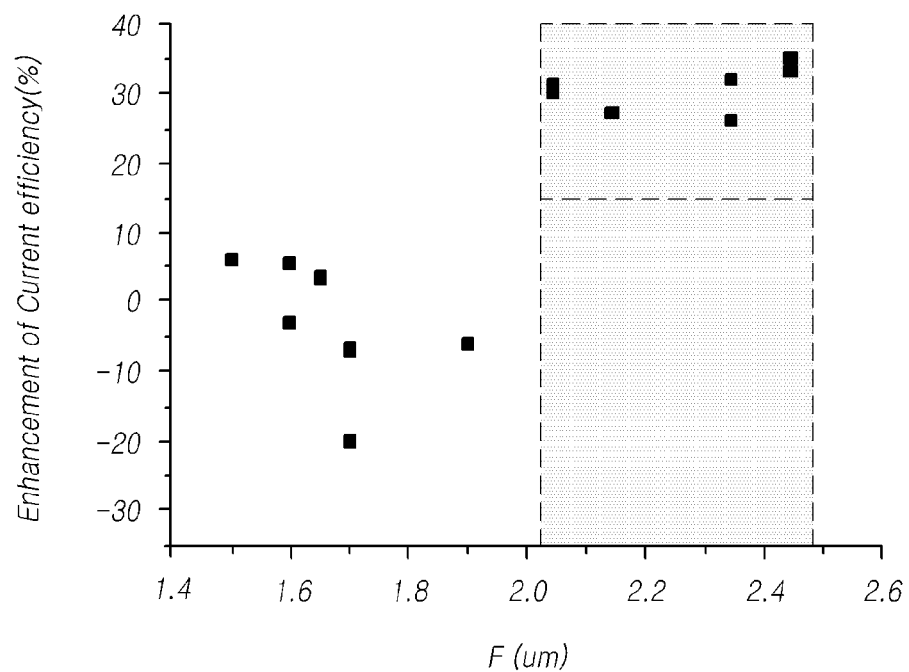
FIG. 6 is a graph illustrating a relationship between current efficiency enhancements (%) or enhancements of current efficiency (%) and a full width at half maximum in respective top emission type organic light emitting diode display devices having various values of the full width at half maximum of a convex portion of an overcoating layer.

FIG. 6 is a graph illustrating a relationship between current efficiency enhancements (%) or enhancements of current efficiency (%) and a full width at half maximum in respective top emission type organic light emitting diode display devices having various values of the full width at half maximum of a convex portion 162 of an overcoating layer 160. In this case, a high current efficiency enhancement means an excellent light emission efficiency.

For example, in the top emission type organic light emitting diode display device 100 in which a diameter D of the convex portion 162 of the overcoating layer 160 is about 4.5 um, a height H is about 1.7 um, and an aspect ratio A/R is 0.76, it may be confirmed that current efficiency enhancement is more excellent in the case in which the full width at half maximum F is about 2.0 um or more than in the case in which the full width at half maximum F is less than about 2.0 um. It may be confirmed that the current efficiency enhancement is rather reduced (i.e., the current efficiency enhancement has a negative value) in the case in which the full width at half maximum F of the convex portion 162 of the overcoating layer 160 has a value less than about 2.0 um.

In summary, even when the aspect ratio A/R of the convex portion 162 of the overcoating layer 160 has an optimal value, when the full width at half maximum F has a value less than about 2.0 um, an angle of light which travels inside the organic light emitting diode 140 becomes greater than or equal to a critical angle for total reflection at which light should be locked between the substrate 110 and the organic light emitting layer 142. Therefore, it may be confirmed that the current efficiency enhancement is rather reduced, and thus the light emission efficiency is reduced.

Meanwhile, an aspect ratio at half maximum F_A/R of the convex portion 162 may be smaller than an aspect ratio A/R. In this case, the aspect ratio at half maximum F_A/R of the convex portion 162 refers to a height H with respect to the full width at half maximum F of the convex portion 162. That is, the aspect ratio at half maximum with respect to the aspect ratio of the convex portion 162 may be smaller than 1.0. As described above, when the aspect ratio A/R of the convex portion 162 is 0.35 or more and 0.8 or less, the aspect ratio at half maximum F_A/R of the convex portion 162 may be, for example, more than 0.30 and 0.6 or less.

As described above, the convex portion 162 of the overcoating layer 160 may have various shapes even when a full width at half maximum F is greater than a radius D/2 and the full width at half maximum F is the same.

For example, the convex portion 162 of the overcoating layer 160 having the full width at half maximum F greater than the radius D/2 may have a shape in which a slope S of the convex portion 162 of the overcoating layer 160 is gradually increased at a bottom with respect to a left upper surface and is gradually decreased again after reaching a maximum slope Smax (i.e., the shape of the convex portion 162 of FIG. 5A).

As described with reference to FIG. 2A, due to a characteristic of the deposition process of the organic light emitting layer 142, an amount of emission of the organic light emitting layer 142 is largest at a position at which a slope of the organic light emitting layer 142 between the convex portion 162 and the first connection portion 161 of the overcoating layer 160 is largest, that is, at a maximum slope Smax.

In other words, when the top emission type organic light emitting diode display device 100 according to one exemplary aspect has a shape in which the slope of the convex portion 162 of the overcoating layer 160 is increased at the bottom and is decreased at the maximum slope (i.e., the shape of the convex portion 162 of FIG. 5A), light emitted from the organic light emitting layer 142 travels at an angle smaller than a critical angle for total reflection, the external light emission efficiency is increased by multiple reflections, and thus maximum external light extraction efficiency may be obtained.

Meanwhile, when the first connection portion 161 of the overcoating layer 160 which connects respective convex portions has a smooth slope, the external light extraction efficiency may be increased. As illustrated in FIG. 3C, the gap G at the bottom of the convex portion 162 is 0. When the gap G is greater than 0, a gap is present between two adjacent first connection portions 161, and because an efficient emission area is reduced, the light emission efficiency may be reduced by an area of the gap G.

Figure 7:
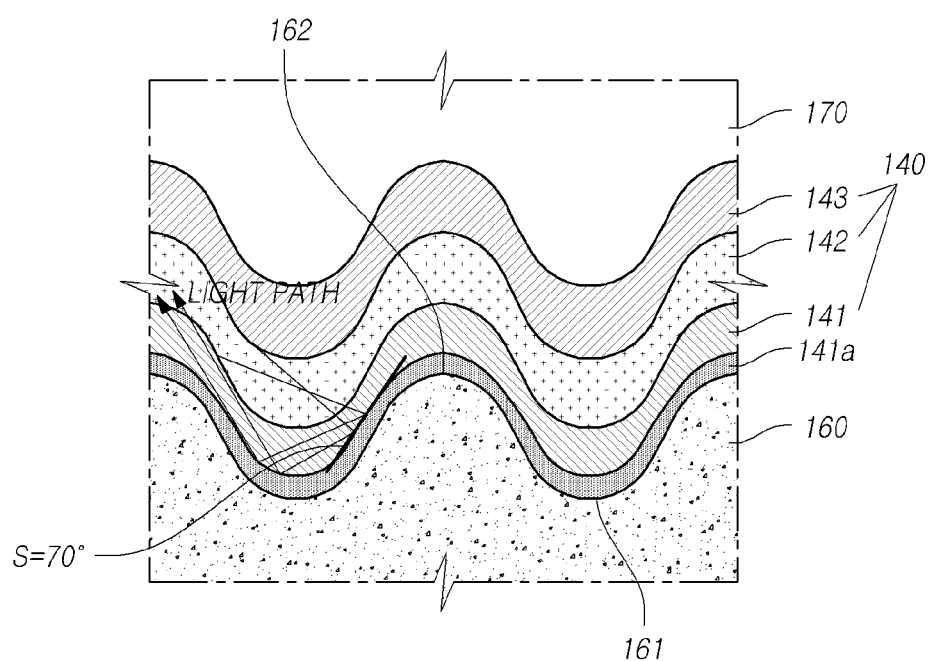
FIG. 7 is a view illustrating a light path according to a maximum slope of a convex portion of an overcoating layer.

FIG. 7 is a view illustrating a light path according to a maximum slope of a convex portion of an overcoating layer.

Referring to FIG. 7, the convex portion 162 of the overcoating layer 160 may have a shape in which the slope is increased at the bottom and is decreased at the maximum slope Smax (i.e., the shape of the convex portion 162 of FIG. 5A) as illustrated in FIG. 5A.

As illustrated in FIG. 7, even when the convex portion 162 of the overcoating layer 160 has the shape in which the slope is increased at the bottom and is decreased at the maximum slope Smax (i.e., the shape of the convex portion 162 of FIG. 5A), the convex portion 162 of the overcoating layer 160 may have various shapes according to an angle of the maximum slope.

As illustrated in FIG. 7, when the convex portion 162 of the overcoating layer 160 has a shape in which the maximum slope Smax has a high angle more than 60 degrees, for example, 70 degrees (i.e., Smax is 70 degrees), a traveling angle of light starting from the efficient emission area becomes 42 degrees or more, as a result, the light is locked in the organic light emitting diode 140, and thus the light emission efficiency may not be increased.

Therefore, when the convex portion 162 of the overcoating layer 160 has a shape in which the maximum slope Smax of the convex portion 162 has an angle ranging from 40 degrees to 60 degrees (e.g., 50 degrees), light emitted from the organic light emitting layer 142 is not locked in the organic light emitting diode 140 in view of the traveling angle of light starting from the efficient emission area, and thus the light emission efficiency may be increased.

Figure 8:
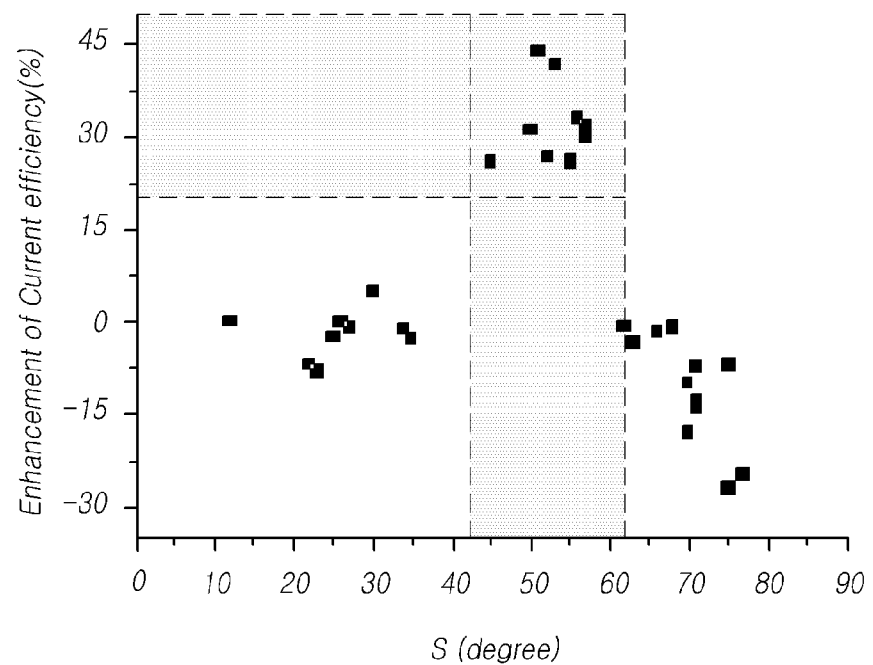
FIG. 8 is a graph illustrating a relationship between current efficiency enhancements (%) or enhancements of current efficiency (%) and a maximum slope (Smax) in respective top emission type organic light emitting diode display devices having various values of the maximum slope (Smax) of a convex portion of an overcoating layer.

FIG. 8 is a graph illustrating a relationship between current efficiency enhancements (%) or enhancements of current efficiency (%) and a maximum slope Smax in respective top emission type organic light emitting diode display devices having various values of the maximum slope Smax of the convex portion 162 of the overcoating layer 160.

Referring to FIG. 8, when the maximum slope Smax of the convex portion 162 of the overcoating layer 160 is less than 40 degrees, because a traveling angle of light in the efficient emission area is not significantly different from a flat organic light emitting diode of the overcoating layer 160, it was confirmed that there is little improvement in efficiency. Further, when the maximum slope Smax of the convex portion 162 of the overcoating layer 160 is more than 60 degrees, a traveling angle of light is greater than a total reflection angle between the substrate 110 and an air layer outside the substrate 110, an amount of light locked in the organic light emitting diode 140 is significantly increased, and thus a result in which the efficiency is somewhat reduced compared to that of the flat organic light emitting diode of the overcoating layer 160 was shown.

As described above, when the shape of the convex portion 162 of the overcoating layer 160 illustrated in FIG. 4 has a maximum slope Smax of the convex portion 162 ranging from 40 degrees to 60 degrees, light emitted from the organic light emitting layer 142 is not locked in the organic light emitting diode 140 in view of the traveling angle of light starting from the efficient emission area, and thus the light emission efficiency may be increased.

Figure 9:
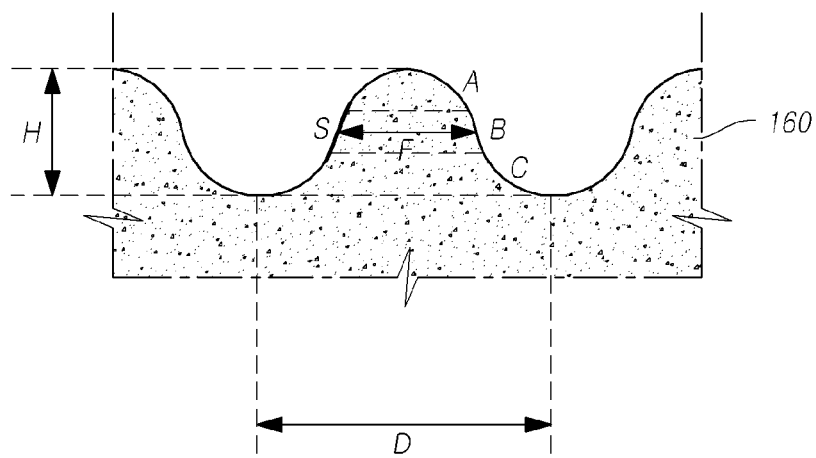
FIG. 9 illustrates an area having a maximum slope according to an aspect ratio at half maximum (Rm) with respect to an aspect ratio of a convex portion.

FIG. 9 illustrates an area having a maximum slope according to an aspect ratio at half maximum Rm with respect to an aspect ratio of a convex portion.

The aspect ratio at half maximum Rm with respect to the aspect ratio of the convex portion 162 is a ratio of an aspect ratio at half maximum F_A/R and an aspect ratio A/R, and may be a variable on which an area having a sharpest maximum slope Smax depends.

Referring to FIG. 9, when the aspect ratio at half maximum Rm with respect to the aspect ratio of the convex portion 162 is more than 1.0, a first area C is an area having a maximum slope Smax. When the aspect ratio at half maximum Rm with respect to the aspect ratio of the convex portion 162 is 1.0, a second area B is an area having a maximum slope Smax. When the aspect ratio at half maximum Rm with respect to the aspect ratio of the convex portion 162 is less than 1.0, a third area A is an area having a maximum slope Smax.

Referring to the light path of light emitted from the organic light emitting layer 142 illustrated in FIG. 4, when the maximum slope Smax of the convex portion 162 is positioned at the third area A adjacent to a top of first to third areas which are trisected from a bottom with respect to a height H, it can be seen that a front light emission efficiency is the best. As described above, when the organic light emitting diode 140 is driven, electric fields are locally concentrated in such an efficient emission area Y, a main current path is formed, and the main emission occurs. On the other hand, light is rarely extracted in an inefficient emission area Z in the convex portion 162 of the overcoating layer 160, and thus the light emission efficiency may be reduced as a maximum slope is positioned at the first area C and the second area B.

As described above, when the overcoating layer 160 includes the convex portion 162, the light extraction efficiency or the light emission efficiency according to the shape of the convex portion 162 has been described. Hereinafter, the case in which the external light extraction efficiency or the light emission efficiency according to a shape of a concave portion is obtained in the same manner as the convex portion 162 even when the overcoating layer 160 includes the concave portion will be described with reference to FIG. 10.

Figure 10:
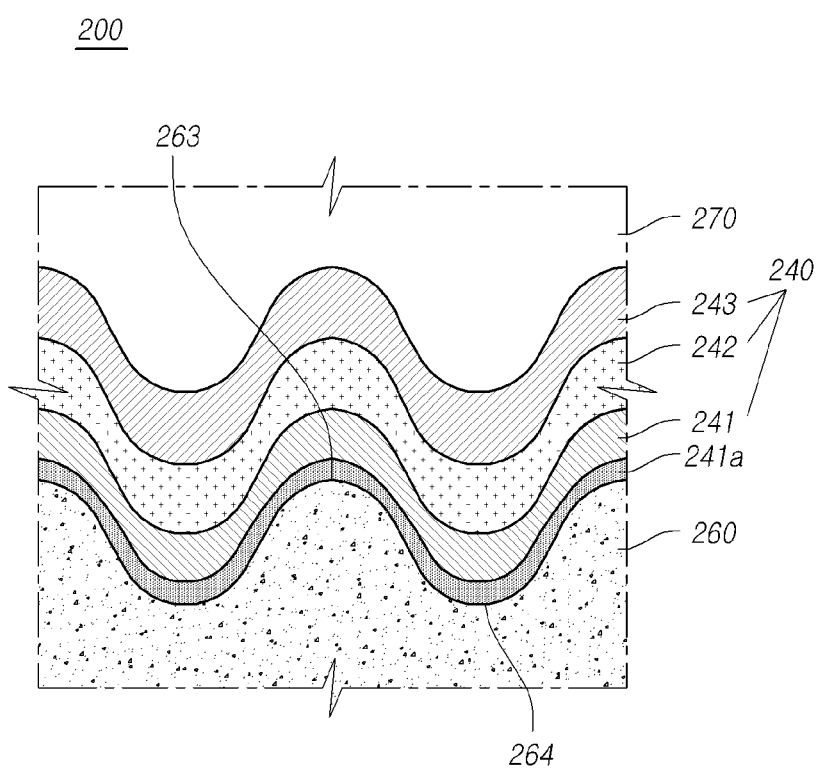
FIG. 10 is a cross-sectional view for describing a top emission type organic light emitting diode display device including an overcoating layer having a plurality of concave portions according to another exemplary aspect.

FIG. 10 is a cross-sectional view for describing a top emission type organic light emitting diode display device including an overcoating layer having a plurality of concave portions according to another exemplary aspect.

Referring to FIG. 10, in a top emission type organic light emitting diode display device 200 according to another exemplary aspect, an overcoating layer 260 includes a plurality of concave portions 264 unlike the top emission type organic light emitting diode display device 100 of FIGS. 1 to 2B, since the other components are the same, redundant description thereof will be omitted. Elements of the organic light emitting display device 200 which are not illustrated in FIG. 10 may be the same as the above-described elements of the top emission type organic light emitting diode display device 100 according to one exemplary aspect.

The overcoating layer 260 includes the plurality of concave portions 264 and second connection portions 263 which connect adjacent concave portions 264. In other words, the overcoating layer 260 includes the plurality of concave portions 264 which are disposed to overlap the opening 136a of the bank layer 136 illustrated in FIG. 1, and the plurality of second connection portions 263 which connect the concave portions 264.

A reflection plate 241a and a first electrode 241 are disposed on the overcoating layer 260. An organic light emitting layer 242 and a second electrode 243 are disposed on the overcoating layer 260 and the first electrode 241. The first electrode 241, the organic light emitting layer 242, and the second electrode 243 may constitute an organic light emitting diode 240. A color filter (not illustrated) which is disposed to overlap the concave portions 264 and the second connection portions 263 which connect adjacent concave portions 264 is disposed on the second electrode 243.

The reflection plate 241a, the first electrode 241, the organic light emitting layer 24, and the second electrode 243 may be disposed along a shape of an upper surface of the overcoating layer 260, and may have a shape depending on a morphology of the overcoating layer 260.

As described with reference to FIGS. 3A and 3B, like the case in which the full width at half maximum F of the convex portion 162 of the overcoating layer 160 is greater than the radius D/2, a full width at half maximum F of the concave portion 264 of the overcoating layer 260 may be greater than a radius D/2. In this case, a ratio of the full width at half maximum F with respect to a radius D/2 of the concave portion 264 may be 1.0 or more.

As described with reference to FIGS. 3A and 3B, like the case in which the aspect ratio at half maximum F_A/R of the convex portion 162 of the overcoating layer 160 is smaller than the aspect ratio A/R, an aspect ratio at half maximum F_A/R of the concave portion 264 of the overcoating layer 260 may be smaller than an aspect ratio A/R. In this case, the aspect ratio at half maximum F_A/R with respect to the aspect ratio A/R of the concave portion 264 may be smaller than 1.0.

In this case, the concave portion 264 may have a hexagonal shape in which a diameter ranges from about 1 μm to about 5 μm and a height ranges from about 1 μm to about 4 μm. The aspect ratio of the concave portion 264 may range from 0.35 to 0.8 and the aspect ratio at half maximum thereof may range from 0.30 to 0.60, but the present disclosure is not limited thereto.

As described with reference to FIGS. 4 and 5A, like the case in which the convex portion 162 of the overcoating layer 160 has a shape in which the slope is increased and is then gradually reduced at the maximum slope, the concave portion 264 of the overcoating layer 260 may have a shape in which a slope is increased at a bottom and is then gradually reduced at a maximum slope.

As described with reference to FIGS. 7 and 8, like the case in which the maximum slope of the convex portion 162 of the overcoating layer 160 ranges from 40 degrees to 60 degrees, a maximum slope of the concave portion 264 of the overcoating layer 260 may range from 40 degrees to 60 degrees.

As described above, the case in which the overcoating layer 260 includes the concave portion 264 is described as having external light extraction efficiency or light emission efficiency according to the shape of the concave portion 264 like the case in which the convex portion 162 of the overcoating layer 160 of the top emission type organic light emitting diode display device 100 described with reference to FIG. 1, but the shapes of the concave portion 264 and the second connection portion 263 according to the omitted variables are the same as those described above with reference to the convex portion 162 and the first connection portion 262.

Figure 11:
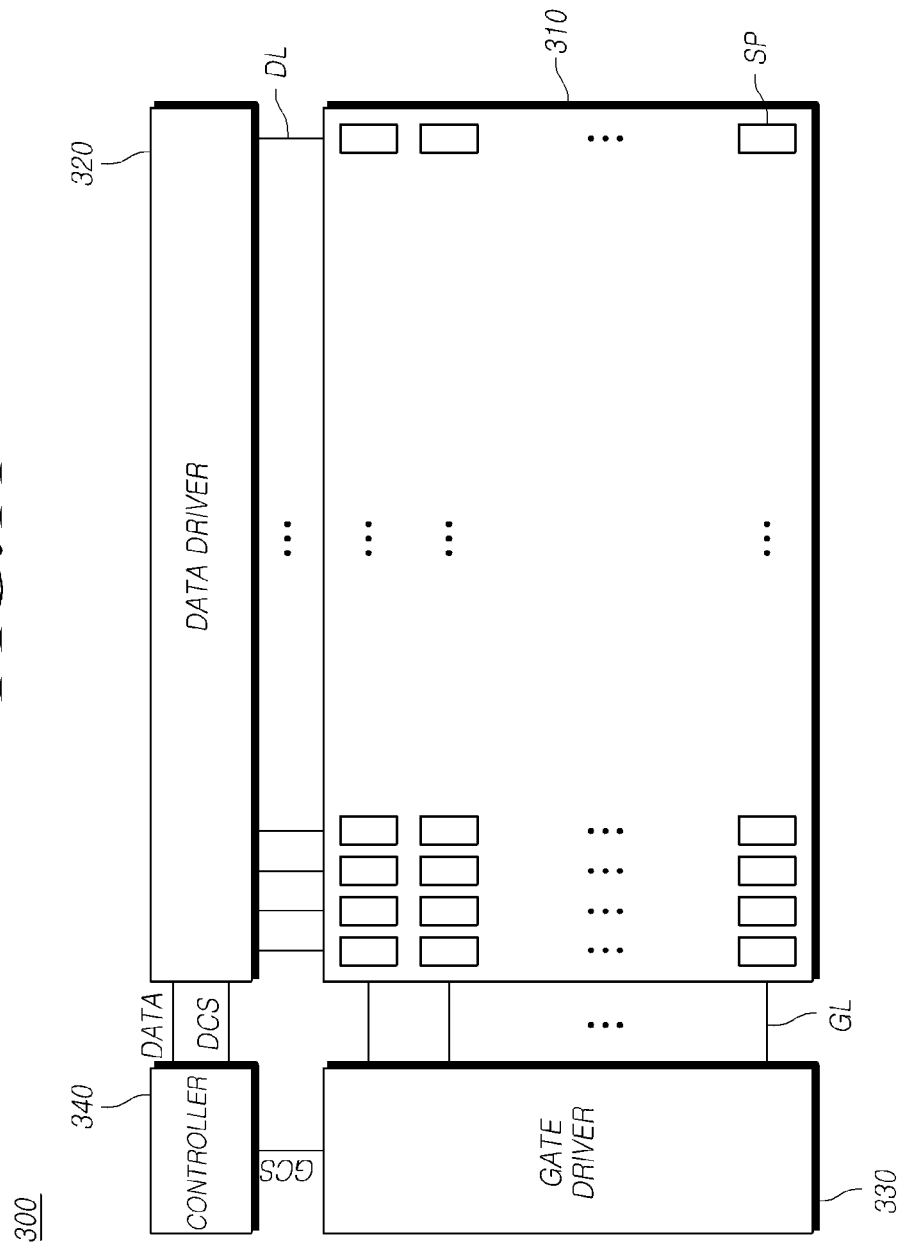
FIG. 11 is a schematic diagram illustrating a configuration of the top emission type organic light emitting diode display device according to the exemplary aspects.

FIG. 11 is a schematic diagram illustrating a configuration of a top emission type organic light emitting diode display device according to exemplary aspects.

Referring to FIG. 11, a top emission type organic light emitting diode display device 300 according to the exemplary aspects includes an organic light emitting display panel 310, a data driver 320, a gate driver 330, and a controller 340. The organic light emitting display panel 310 includes a plurality of data lines DLs, a plurality of gate lines GLs, and a plurality of sub pixels SPs which is disposed in a matrix form. The data driver 320 drives the plurality of data lines by supplying a data voltage to the plurality of data lines. The gate driver 330 subsequently drives the plurality of gate lines by sequentially supplying a scanning signal to the plurality of gate lines. The controller 340 controls the data driver 320 and the gate driver 330.

The thin film transistor and the organic light emitting diode which are described with reference to FIG. 1 are included in each of a plurality of pixels disposed on the organic light emitting display panel 310 according to the exemplary aspects.

According to the above-described exemplary aspects, a micro lens array structure may be applied to the top emission type organic light emitting diode display device so that external light extraction efficiency may be improved.

According to the above-described exemplary aspects, the top emission type organic light emitting diode display device may improve external light emission efficiency and reduce power consumption.

According to the above-described exemplary aspects, a life span of the top emission type organic light emitting diode display device may be increased.

The above description is only an example describing the technological scope of the present disclosure. Various changes, modifications, and replacements may be made without departing from the spirit and scope of the present disclosure by those skilled in the field of medical devices. Therefore, the exemplary aspects disclosed above and in the accompanying drawings should be considered in a descriptive sense only and not for limiting the technological scope. The technological scope of the present disclosure is not limited by these aspects or the accompanying drawings. The spirit and scope of the present disclosure should be interpreted by the appended claims and encompass all equivalents falling within the scope of the appended claims.

What is claimed is:

1. A top emission type organic light emitting diode display device, comprising:
    an overcoating layer disposed over a substrate and having at least one of a plurality of convex portions and a plurality of concave portions in which a full width at half maximum is greater than a radius;
    a first electrode disposed over the overcoating layer;
    an organic light emitting layer disposed on the first electrode; and
    a second electrode disposed on the organic light emitting layer,
    wherein at least one of the plurality of convex portions has a shape with a slope increased from a bottom portion and decreased after a maximum slope and has first to third areas which are trisected from a bottom to a top, and the maximum slope of the at least one of the plurality of convex portions is positioned at the third area, and
    wherein the organic light emitting layer has a first thickness corresponding to the top of the at least one of the plurality of convex portions and a second thickness corresponding to a lateral side of the third area, and the first thickness is greater than the second thickness.

2. The top emission type organic light emitting diode display device according to claim 1, further comprising:
    a reflection plate disposed between the first electrode and the overcoating layer.

3. The top emission type organic light emitting diode display device according to claim 2, wherein the reflection plate, the first electrode, the organic light emitting layer, and the second electrode are disposed to match a shape of an upper surface of the overcoating layer, and have a shape determined by a morphology of the overcoating layer.

4. The top emission type organic light emitting diode display device according to claim 2, wherein the first electrode and the reflection plate function as a multiple electrode.

5. The top emission type organic light emitting diode display device according to claim 1, further comprising a color filter disposed on the second electrode.

6. The top emission type organic light emitting diode display device according to claim 1, wherein each of the convex portions or the concave portions has a ratio of the full width at half maximum to the radius to be 1.0 or more.

7. The top emission type organic light emitting diode display device according to claim 1, wherein each of the convex portions or the concave portions has an aspect ratio at the full width at half maximum smaller than an aspect ratio thereof.

8. The top emission type organic light emitting diode display device according to claim 7, wherein each of the convex portions or the concave portions has a ratio of the aspect ratio at the full width at half maximum to the aspect ratio thereof to be smaller than 1.0.

9. The top emission type organic light emitting diode display device according to claim 7, wherein each of the convex portions or the concave portions has the aspect ratio at the full width at half maximum ranging from about 0.35 to about 0.8, and the aspect ratio at half maximum ranging from about 0.30 to about 0.60.

10. The top emission type organic light emitting diode display device according to claim 1, wherein each of the convex portions or the concave portions has a circular shape with a diameter ranging from about 1 μm to about 5 μm and a height ranging from about 1 μm to about 4 μm.

11. The top emission type organic light emitting diode display device according to claim 1, wherein each of the convex portions or the concave portions has the maximum slope ranging from about 40 degrees to about 60 degrees.

12. The top emission type organic light emitting diode display device according to claim 1, wherein the overcoating layer is formed of a negative photoresist having an exposed portion to be cured.

13. The top emission type organic light emitting diode display device according to claim 1, wherein the organic light emitting layer has a maximum current efficiency enhancement at the third area of the convex portions.

14. An organic light emitting diode display device, comprising:
    an overcoating layer having at least one of a plurality of convex portions and a plurality of concave portions, each having a full width at half maximum greater than a radius;
    a reflection plate on the overcoating layer and substantially matching a contour of an upper surface of the overcoating layer;
    a first electrode disposed on the reflection plate and substantially matching a contour of an upper surface of the reflection plate; and an organic light emitting layer disposed on the first electrode and substantially matching a contour of an upper surface of the first electrode, wherein at least one of the plurality of convex portions has a shape with a slope increased from a bottom portion and decreased after a maximum slope and has first to third areas which are trisected from a bottom to a top, and the maximum slope of the at least one of the plurality of convex portions is positioned at the third area, and wherein the organic light emitting layer has a first thickness corresponding to the top of the at least one of the plurality of convex portions and a second thickness corresponding to a lateral side of the third area, and the first thickness is greater than the second thickness.

15. The organic light emitting diode display device according to claim 14, wherein each of the convex portions or the concave portions has an aspect ratio ranging from about 0.35 to about 0.8, and an aspect ratio at half maximum ranging from about 0.30 to about 0.60.

16. The organic light emitting diode display device according to claim 14, wherein each of the convex portions or the concave portions has a ratio of the full width at half maximum to the radius to be 1.0 or more.

17. The organic light emitting diode display device according to claim 14, wherein each of the convex portions or the concave portions has an aspect ratio at the full width at half maximum smaller than an aspect ratio thereof.

18. The organic light emitting diode display device according to claim 14, wherein each of the convex portions or the concave portions has a maximum slope ranging from about 40 degrees to about 60 degrees.

* * * * *